(12) United States Patent
Roozeboom et al.

(10) Patent No.: US 8,395,267 B2
(45) Date of Patent: Mar. 12, 2013

(54) THROUGH-SUBSTRATE VIA AND REDISTRIBUTION LAYER WITH METAL PASTE

(75) Inventors: Freddy Roozeboom, Waalre (NL); Eric Cornelis Egbertus Van Grunsven, Someren (NL); Franciscus Hubertus Marie Sanders, Eindhoven (NL); Maria Mathea Antonetta Burghoorn, Geldrop (NL)

(73) Assignee: NXP B.V., Eindhoven (NL)

( * ) Notice: Subject to any disclaimer, the term of this patent is extended or adjusted under 35 U.S.C. 154(b) by 76 days.

(21) Appl. No.: 13/126,286

(22) PCT Filed: Oct. 21, 2009

(86) PCT No.: PCT/IB2009/054641
§ 371 (c)(1),
(2), (4) Date: Apr. 27, 2011

(87) PCT Pub. No.: WO2010/049852
PCT Pub. Date: May 6, 2010

(65) Prior Publication Data
US 2011/0210452 A1    Sep. 1, 2011

(30) Foreign Application Priority Data

Oct. 30, 2008    (EP) .................................... 08167954

(51) Int. Cl.
*H01L 23/48*          (2006.01)
(52) U.S. Cl. ........... 257/774; 257/E23.01; 257/E21.597; 257/773; 257/668; 257/678; 257/686; 257/777; 257/723
(58) Field of Classification Search .................. 257/774, 257/E23.01, E21.597, 773, 668, 678, 686, 257/777, 723
See application file for complete search history.

(56) References Cited

U.S. PATENT DOCUMENTS

| 2002/0109236 A1 | 8/2002 | Kim et al. |
| 2004/0043596 A1 | 3/2004 | Sasaki et al. |
| 2004/0161926 A1 | 8/2004 | Yamaguchi |

(Continued)

FOREIGN PATENT DOCUMENTS

| WO | 2006/003583 A1 | 1/2006 |
| WO | 2006/056959 A1 | 6/2006 |
| WO | 2006/056963 A2 | 6/2006 |
| WO | 2006/092747 A1 | 9/2006 |

(Continued)

OTHER PUBLICATIONS

Roozeboom, F., et al; "High-Density, Low-Loss MOS Decoupling Capacitors Integrated in a GSM Power Amplifier"; Proceedings 34th Int. Symp. on Micorlectronics (IMAPS 2001), Baltimore, MD, US; pp. 477-483 (Oct. 2001).

(Continued)

*Primary Examiner* — A O Williams

(57) ABSTRACT

A semiconductor device and a method for manufacturing such semiconductor device for use in a stacked configuration of the semiconductor device are disclosed. The semiconductor device includes a substrate including at least part of an electronic circuit provided at a first side thereof. The substrate includes a passivation layer and a substrate via that extends from the first side to a via depth such that it is reconfigurable into a through-substrate. The semiconductor device further includes a patterned masking layer on the first side of the substrate. The patterned masking layer includes a trench extending fully through the patterned masking layer. The trench has been filled with a redistribution conductor. The substrate via and the redistribution conductor include metal paste and together form one piece, such that there is no physical interface between the through-substrate via and the redistribution conductor. Thus, the parasitic resistance of this electrical connection is reduced.

14 Claims, 6 Drawing Sheets

U.S. PATENT DOCUMENTS

| | | | |
|---|---|---|---|
| 2005/0014311 A1 | 1/2005 | Hayasaka et al. | |
| 2005/0046002 A1 | 3/2005 | Lee et al. | |
| 2007/0026309 A1* | 2/2007 | Notten et al. | 429/209 |
| 2007/0048994 A1 | 3/2007 | Tuttle | |
| 2007/0096289 A1 | 5/2007 | Enomoto et al. | |

FOREIGN PATENT DOCUMENTS

| | | |
|---|---|---|
| WO | 2007/054858 A2 | 5/2007 |
| WO | 2007/089206 A1 | 8/2007 |
| WO | 2007/125510 A2 | 11/2007 |
| WO | 2007/131967 A1 | 11/2007 |
| WO | 2007/132423 A2 | 11/2007 |
| WO | 2007/141722 A1 | 12/2007 |
| WO | 2008/139393 A1 | 11/2008 |
| WO | 2009/063408 A1 | 5/2009 |
| WO | 2010/038174 A1 | 4/2010 |

OTHER PUBLICATIONS

Roozeboom, F., et al.; "Passive and Heterogeneous Integration Towards a Silicon-Based System-In-Package Concept"; Thin Solid Films, 504; pp. 391-396 (2006).

Roozeboom, F., et al.; "ALD-Options for Si-Integrated Ultrahigh-Density Decoupling Capacitors in Proe and Trench Designs"; Electrochem. Soc. Trans. 3 (15) pp. 173-181 (2007).

Notten, P.H.L., et al.; "3-D Integrated All-Solid-State Rechargeable Batteris"; Adv. Mat (Nov. 2007).

Roozeboom, F., et al.; "3-Dimensional Passive and Heterogenous Integration Technology Options for System-In-Package"; IEEE Workshop on 3D System Integration; Munich, DE (Oct. 2007).

Garrous, P., et al.; "Handbook of 3-D Integration: Technology and Applications of 3D Integrated Circuits"; Wiley, VCH Verlag, Weinheim, p. 511 (2008).

Roozeboom, F., et al.; "System-In-Package Integration of Passives Using 3D Through-Silicon Vias"; Solid State Technology, pp. 38-41+47 (May 2008).

International Search Report and Written Opinion for Application PCT/IB2009/054641 (Feb. 26, 2010).

* cited by examiner

THROUGH-SUBSTRATE VIA AND REDISTRIBUTION LAYER WITH METAL PASTE

FIELD OF THE INVENTION

The invention relates to a semiconductor device for use in a stacked configuration of the semiconductor device and a further semiconductor device. The invention further relates to a method of manufacturing a semiconductor device for use in a stacked configuration of the semiconductor device and a further semiconductor device. The invention also relates to a semiconductor device assembly comprising a stacked configuration of a plurality of semiconductor devices.

BACKGROUND OF THE INVENTION

In electronics, a three-dimensional integrated circuit (3D IC, 3D-IC, or 3-D IC) is a chip with two or more layers of active electronic components (semiconductor devices), integrated both vertically and horizontally into a single circuit. The semiconductor industry is hotly pursuing this promising technology in many different forms. Consequently, the definition is still not yet completely fixed. 3D packaging saves space by stacking separate chips in a single package. This packaging, known as System in Package (SiP) or Chip Stack MCM, does not integrate the chips into a single circuit. The chips in the package communicate with off-chip signaling, much as if they were mounted in separate packages on a normal circuit board. In contrast, a 3D IC is effectively a single chip. All components on the layers communicate with on-chip signaling, whether vertically or horizontally. Essentially, a 3D IC bears the same relation to a 3D package that an SoC bears to a circuit board. An additional advantage of 3D IC is the reduced RC delays (no "slow" off-chip signaling, but only fast on-chip signaling).

When integrated circuits (semiconductor devices) are stacked there is also a need for interconnections that extend through the substrate of the semiconductor devices. Such through-substrate interconnections are also called through-substrate vias. Furthermore, as the location of the through-substrate vias may be different between the respective semiconductor devices there has been a need to make an interfacing layer between the semiconductor devices. This layer is also called the redistribution layer. The redistribution layer is typically manufactured after the back-end-of-line stage (BEOL) of the process. The back-end-of-line stage is the stage in which the interconnect stack of the semiconductor device is manufactured. In other words, the redistribution layer is provided after provision of the passivation layer which is considered to be the last BEOL-step in the manufacturing of a semiconductor device.

The redistribution layer typically comprises at least one redistribution conductor which serves to reroute the location of a through-substrate via of the semiconductor device to another location such that the further semiconductor device, which has a different location of the through-substrate via, can be stacked on the semiconductor device. Another function of the redistribution layer is to make contacting of the through-substrate vias easier (bond-pad function).

A semiconductor device of the kind set forth in the opening paragraph is known. The known semiconductor device comprises a substrate with an electronic circuit. The substrate is covered with a passivation layer extending over bonding pads and the electronic circuit and has a substrate via that extends to a via depth beyond a depth of the electronic circuit such that it is reconfigurable into a through-substrate via by backside thinning of the substrate. The through-substrate via comprises a conductive paste, such as (vacuum printed) copper paste; silver paste, etc. The known semiconductor device further comprises a patterned masking layer on the substrate. The patterned masking layer comprises at least a trench opening which extends fully through the patterned masking layer. The trench is filled with an electroplated redistribution conductor.

The problem with the known semiconductor device is that the electrical performance is not good enough.

The problem with the known semiconductor device is that the electrical performance is not good enough.

A method of the kind set forth in the opening paragraph is known. The known method comprises:

providing a substrate with an electronic circuit and being covered with a passivation layer, the substrate having a via hole that extends to a via depth beyond a depth of the electronic circuit for defining a location of a through-substrate via to be formed;

filling the hole with a metal paste to obtain a substrate via;

planarizing the substrate to confine the substrate via within the hole;

cleaning the surface of the substrate;

providing a masking layer on the passivation layer, wherein the masking layer comprises a first trench extending through the masking layer and defining a shape of a redistribution conductor to be formed above the passivation layer, and filling the trench with a conductor by means of electroplating.

The problem with the known method is that this method is relatively expensive.

SUMMARY OF THE INVENTION

It is a first object of the invention to provide a semiconductor device having a better electrical performance.

It is a second object of the invention to provide a method of manufacturing such semiconductor device which is less expensive.

The invention is defined by the independent claims. The dependent claims define advantageous embodiments.

In a first aspect, the invention relates to a semiconductor device for use in a stacked configuration of the semiconductor device and a further semiconductor device, the semiconductor comprising:

a substrate comprising at least part of an electronic circuit provided at a first side thereof, the substrate comprising a passivation layer at the first side and having a substrate via that extends from the first side to a via depth beyond a depth of the electronic circuit such that it is reconfigurable into a through-substrate via by backside thinning of the substrate, and a patterned masking layer on the first side of the substrate, wherein the patterned masking layer comprises at least a trench extending fully through the patterned masking layer and being filled with a redistribution conductor, and wherein the substrate via and the redistribution conductor comprise metal paste and together form one piece.

The effect of the features of the semiconductor device in accordance with the invention can be understood as follows. The through-substrate via and the redistribution conductor form together one piece. This means that there is no physical interface between those two parts. In many applications the through-substrate via and the redistribution conductor together constitute an electrical connection to the electronic circuit. In operational use the electrical performance of this electronic circuit may be hampered by parasitic effects like resistances and capacitances of the interconnections. As a consequence of the invention the (parasitic) resistance (which included the interface contact resistance) of this electrical connection is reduced, which results in a better electrical performance of the semiconductor device. Thus the first object of the invention is achieved.

In an embodiment of the semiconductor device in accordance with the invention the first side of the substrate is planar, and wherein the redistribution conductor is confined within the trench. The planarity of this embodiment makes the semiconductor device suitable for further processing. Also, the first redistribution conductor is complete in this embodiment.

An embodiment of the semiconductor device in accordance with the invention comprises a patterned insulating layer on the patterned masking layer and the redistribution conductor, the patterned insulating layer having an opening extending to the redistribution conductor. Such first patterned insulating layer serves for protection of the first redistribution conductor, but also provides a higher mechanical stability of the semiconductor device. Moreover, the first patterned insulating layer ensures a proper electrical insulation of the first redistribution conductor. The first opening is defined at a location where the first redistribution conductor is to be contacted.

An embodiment of the semiconductor device in accordance with the invention comprises a solder ball at least in the opening in the patterned insulating layer for providing an electrical connection to the redistribution conductor. Such solder ball provides a convenient and reliable electrical connection to the first redistribution conductor.

An embodiment of the semiconductor device in accordance with the invention comprises a further patterned masking layer on the patterned insulating layer, wherein the further patterned masking layer comprises at least a further trench extending through the further patterned masking layer and defining a shape of a further redistribution conductor to be formed. This embodiment is very advantageous, because it features provision of a second redistribution conductor on top of the first redistribution conductor.

In an embodiment of the semiconductor device in accordance with the invention the opening and the further trench in the further patterned masking layer contain a further metal paste for forming the further redistribution conductor. In this embodiment the second redistribution conductor is a fact. The combination of the first redistribution conductor and the second redistribution conductor increases the routability of the position of the through-substrate vias to be formed. In a single layer redistribution scheme, for instance, there is no option of letting two electrical paths cross each other; something which is possible with the embodiment here described.

In an embodiment of the semiconductor device in accordance with the invention the first side of the substrate is planar, and the further redistribution conductor is confined within the opening and the further trench. The planarity of this embodiment makes the semiconductor device suitable for further processing. Also, the second redistribution conductor is complete in this embodiment.

An embodiment of the semiconductor device in accordance with the invention comprises a further patterned insulating layer on the further patterned masking layer and the further redistribution conductor, the further patterned insulating layer having a further opening extending to the further redistribution conductor. Such second patterned insulating layer may be used for protection of the second redistribution conductor, but also provides a higher mechanical stability of the semiconductor device. The second opening is defined at a location where the second redistribution conductor is to be contacted.

An embodiment of the semiconductor device in accordance with the invention comprises a further solder ball at least in the further opening in the further patterned insulating layer for providing an electrical connection to the further redistribution conductor. Such further solder ball provides a convenient and reliable electrical connection to the second redistribution conductor.

In an embodiment of the semiconductor device in accordance with the invention the substrate has been thinned down at a second side thereof such that the metal paste in the substrate via is exposed at the second side of the substrate to obtain the through-substrate via, wherein the second side of the substrate is defined as the side opposite to the first side. In this embodiment the through-substrate via is complete and can be contacted from the second side of the substrate.

An embodiment of the semiconductor device in accordance with the invention comprises a patterned backside isolation layer on the second side of the substrate, wherein the patterned backside isolation layer has a backside opening at a location of the through-substrate via. Such patterned backside patterned layer serves for protection of the backside of the substrate. Moreover, the patterned backside isolation layer ensures a proper electrical insulation of the through-substrate via. The further opening is defined at a location where the first redistribution conductor is to be contacted.

An embodiment of the semiconductor device in accordance with the invention comprises a backside redistribution conductor at least in the backside opening on the second side of the substrate and covering at least part of the patterned backside isolation layer, wherein the backside redistribution conductor is electrically connected to the through-substrate via. When a further redistribution conductor is present on the backside of the substrate the routability of the through-substrate via increases. Moreover, the further redistribution conductor makes electrical contacting of the through-substrate via easier.

In an embodiment of the semiconductor device in accordance with the invention the substrate comprises a semiconductor body and at least one interconnect layer on the semiconductor body, and the electronic circuit comprises an active element integrated into the semiconductor body and further comprises an interconnecting wire integrated into the at least one interconnect layer, and the interconnect layer is covered with the passivation layer. In an embodiment of the semiconductor device in accordance with the invention the substrate via extends through the passivation layer, the interconnect layer, and into the semiconductor layer.

In a second aspect, the invention relates to a method of manufacturing a semiconductor device for use in a stacked configuration of the semiconductor device and a further semiconductor device, the method comprising:

providing a substrate with at least part of an electronic circuit provided at a first side thereof and comprising a passivation layer at the first side, the substrate having a hole that extends from the first side to a via depth beyond a depth of the electronic circuit for defining a location of a through-substrate via to be formed;

providing a patterned masking layer on the first side of the substrate, wherein the patterned masking layer comprises at least a trench extending through the patterned masking layer and defining a shape of a redistribution conductor to be formed, and filling the hole and the trench in the patterned masking layer with a metal paste in a single process step to obtain a substrate via and the redistribution conductor, wherein the substrate via is reconfigurable into the through-substrate via by backside thinning of the substrate.

The effect of the features of the method in accordance with the invention can be understood as follows. This sequence of processing steps results in a simultaneous formation of the through-substrate via and the redistribution layer. This saves at least one filling step (i.e. in the prior art this is the separate formation of the redistribution layer using electroplating), one planarization step, and one cleaning step (i.e. in the prior art this is the cleaning step right after formation of the through-substrate vias). Moreover, the inventors have realized that metal paste filling is suitable for manufacturing of a redistribution layer. Whereas in the prior art the patterned masking layer is provided after completion of the formation of the through-substrate vias (i.e. after a planarization step to remove excess material above the opening), in the invention this is done before the actual filling of the opening. It is this specific feature which opens up the possibility to fill up both the opening as well as the trench using a single metal paste filling step. Saving process steps implies saving time and costs. Furthermore, filling the hole and the trench with metal paste is a relatively cheap technique when compared with metal electroplating as is done in the prior art. This further reduces the costs of the method in accordance with the invention. Thus the second object of the invention is achieved.

Another difference with the prior art is that the patterned masking layer needs no longer be removed. It may be made of a material which is mechanically stable. An advantage of leaving the patterned masking layer is that a planar surface is easily obtained which is beneficial for further processing steps.

The embodiments of the method discussed below have similar advantages and effects as those of the corresponding embodiments of the semiconductor device.

An embodiment of the method in accordance with the invention further comprises:
planarizing the first side of the substrate at least until the patterned masking layer is reached.

An embodiment of the method in accordance with the invention further comprises:
providing a patterned insulating layer on the patterned masking layer and the redistribution conductor, the patterned insulating layer having an opening extending to the redistribution conductor.

An embodiment of the method in accordance with the invention further comprises:
applying a solder ball at least in the opening in the patterned insulating layer for providing an electrical connection to the redistribution conductor.

An embodiment of the method in accordance with the invention further comprises:
providing a further patterned masking layer on the patterned insulating layer, wherein the further patterned masking layer comprises at least a further trench extending through the further patterned masking layer and defining a shape of a further redistribution conductor to be formed.

In an embodiment of the method in accordance with the invention further comprises:
filling the opening and the further trench in the further patterned masking layer with a further metal paste in a single process step to obtain the further redistribution conductor.

An embodiment of the method in accordance with the invention further comprises:
planarizing the first side of the substrate for exposing the further patterned masking layer.

An embodiment of the method in accordance with the invention further comprises:
providing a further patterned insulating layer on the further patterned masking layer and the further redistribution conductor, the further patterned insulating layer having a further opening extending to the further redistribution conductor.

An embodiment of the method in accordance with the invention further comprises:
applying a further solder ball at least in the further opening in the further patterned insulating layer for providing an electrical connection to the further redistribution conductor.

An embodiment of the method in accordance with the invention further comprises:
thinning down of a second side of the substrate for exposing the metal paste of the substrate via at the second side of the substrate to obtain the through-substrate via, wherein the second side of the substrate is defined as the side opposite to the first side.

An embodiment of the method in accordance with the invention further comprises:
applying a patterned back-side isolation layer on the second side of the substrate, wherein the patterned back-side isolation layer has a back-side opening at a location of the through-substrate via.

An embodiment of the method in accordance with the invention further comprises:
applying a back-side redistribution conductor at least in the back-side opening on the second side of the substrate and covering at least part of the patterned back-side isolation layer, wherein the back-side redistribution conductor is electrically connected to the through-substrate via. The techniques applied here are similar to those applied on the front-side.

In an embodiment of the method in accordance with the invention, in the providing of the substrate, the substrate comprises a semiconductor body and at least one interconnect layer on the semiconductor body, wherein the electronic circuit comprises an active element integrated into the semiconductor body and further comprises an interconnecting wire integrated into the at least one interconnect layer, wherein the interconnect layer is covered with the passivation layer.

In an embodiment of the method in accordance with the invention, in the providing of the substrate, the hole extends through the passivation layer, the interconnect layer, and into the semiconductor layer.

In an embodiment of the method in accordance with the invention, in the providing of the substrate, the trench and the hole overlap in a perpendicular projection onto the substrate.

In a third aspect, the invention relates to a semiconductor assembly comprising a stacked configuration of a plurality of semiconductor devices, wherein each respective through-substrate via of each respective one of the plurality of semiconductor devices is electrically connected to another respective through-substrate via of another respective one of the plurality of semiconductor devices. The stacking of a plurality of semiconductor device so as to form a 3D semiconductor assembly is a very advantageous application of the invention. Such assembly effectively behaves as a single integrated circuit and may be mounted into a single package.

These and other aspects of the invention are apparent from and will be elucidated with reference to the embodiments described hereinafter.

DETAILED DESCRIPTION OF THE PREFERRED EMBODIMENT

Figure 1:
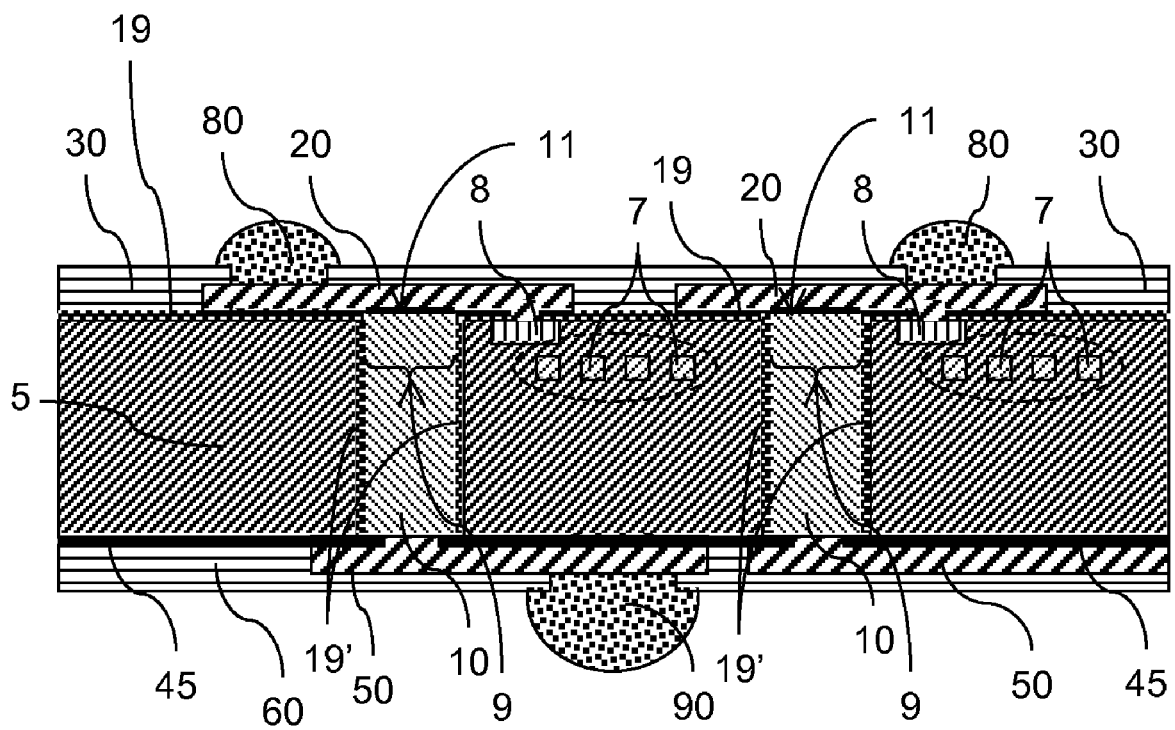
FIG. 1 shows a semiconductor device for use in a stacked configuration of the semiconductor device and a further semiconductor device as known from the prior art.

The method of manufacturing in accordance with the invention with all its embodiments effectively constitutes an efficient redistribution layer (RDL) technology that combines vertical and horizontal interconnect, which results in a cost-efficient manufacturing method for certain applications (e.g. grounding). The semiconductor device in accordance with the invention with all its embodiments effectively resolves the interface-problem between the through-substrate via and the redistribution layer. Things have become easier now that the RDL is applied directly in one single step with a neat large surface which make further treatment of the layer easier, such as UBM contacting.

In order to facilitate the discussion of the detailed embodiments a few expressions are defined hereinafter.

Throughout this description the term "interconnect layer" should be considered as synonym to "metallization layer" or "metal layer". Both terms are used interchangeably and have to be interpreted as the layer comprising conductors (any conducting material), the insulating layer in which the conductors are embedded, and any vias (=contacts) to underlying layers. These terms are well-known to the person skilled in the art of semiconductor technology.

Throughout this description the term "substrate" should be interpreted broadly. The substrate may comprise a functional layer at its front-side elements, e.g. transistors, capacitors, resistors, diodes, and inductors, which form the components of an electronic circuit. The substrate may further comprise interconnections between the elements which may be laid out in one or more interconnect layers. In the figures, the elements have been left out in order to facilitate the understanding of the invention.

The functional layer in which the elements are formed may also be called a semiconductor body. The semiconductor body may comprise any one of the following semiconductor materials and compositions like silicon (Si), germanium (Ge), silicon germanium (SiGe), gallium-arsenide (GaAs) and other III-V compounds like indium-phosphide (InP), other II-VI compounds such as cadmium sulfide (CdS), or combinations of these materials and compositions. The active elements together may form an electronic circuit. In any case, connection of the active elements is done via interconnect layers. These interconnect layers have parasitic capacitances which are defined by the dielectric constant of surrounding materials. The semiconductor body may even comprise contacts to lower layers (e.g. diffusion regions at the surface of an active region).

In this description the term "front-side" of a semiconductor device is defined as the side of the semiconductor device on which circuitry is provided. Likewise, the "back-side" of the semiconductor device is defined as the side opposite to the front-side. Often there is no circuitry on the backside. However, developments are visible in the prior art which go more and more in this direction.

In this description the term "through-substrate via" is defined as an electrical contact which extends through the substrate and which enables contacting on the backside. Other terms which are considered to have the same meaning are: "through-silicon via", "through-substrate plug", "through-substrate contact", and through-wafer interconnect.

In this description the term "redistribution layer" is defined as a further interconnect layer located above (there may be (a) layer(s) in between) or on-top of a passivation layer which covers the interconnect layers. The redistribution layer serves to reroute a location of a through-substrate via of the semiconductor device to another location, such that the further semiconductor device, which has a different location of the through-substrate via, can be stacked on the semiconductor device.

In this description the term "passivation layer" is defined as a layer covering the interconnect stack, which serves for increasing the mechanical stability of the interconnect stack and for protection.

FIG. 1 shows a semiconductor device for use in a stacked configuration of the semiconductor device and a further semiconductor device as known from the prior art. The semiconductor device comprises a substrate 5. The substrate comprises active and passive functions 7. Examples of such active and passive functions 7 are transistors, diodes, capacitors, coils, etc., respectively. The active and passive functions 7 can be interconnected by means of interconnect (not shown) and thereby form an electronic circuit. In 3D-stacked configuration different dies exist, such as passive dies, active dies, and MEMS dies. A passive die is a die on which resistors, inductors, and capacitances are integrated. An active die is a die on which transistors, diodes, thyristors, etc., are integrated. A micro-electromechanical system (MEMS) die is a die on which sensors, actuators, etc., are integrated.

The substrate 5 comprises two through-holes 9 with a through-substrate via 10 that extend fully from one side to the other. The through-substrate via 10 comprises a conductive material, such as a metal paste. Terminals (input, output or a supply terminal) of the electronic circuit are connected to bondpads 8 by means of interconnect (not shown). The bondpads 8 are laid out in at least an upper one of the interconnect layers. The interconnect layers are covered with an electrically insulating layer 19. The respective through-substrate vias 10 are electrically isolated from the substrate 5 by means of a further insulating layer 19', which may comprise the same material or a different material than that of the earlier-mentioned insulating layer 19. In this example, the insulating layer 19 is the passivation layer of the substrate, but this is not necessarily true (the passivation layer may also be located underneath the insulating layer 19. The passivation layer may comprise silicon nitride ($Si_3N_4$), silicon oxide ($SiO_2$), oxy-nitride, oxide/nitride, or any other suitable insulating material. Each respective one of the bondpads 8 is electrically connected to a respective one of the through-substrate vias 10 via a respective redistribution conductor 20 that is located, at a front-side of the substrate 5, above the passivation layer 19. The redistribution conductors 20 comprise conductive material such as electroplated metal or deposited metal (using physical vapor deposition (including sputtering), (e-beam)-evaporation, etc. Metals which are used for this are: copper (Cu), gold, aluminum, nickel. Because, of the fact these elements have been manufactured in different steps using different techniques, there are interfaces 11 between the respective through-substrate vias 10 and the respective redistribution conductors 20. The redistribution conductors 20 are covered with a protection layer 30, such as a solder resist, silicon oxide or nitride, BCB, polyimid, SU-8. The protection layer 30 comprises openings that extend to the redistribution conductors 20 such that the redistribution conductors 20 may be connected to other substrates and/or pins of a package. Such connections may be established by solder balls 80 for example (mostly made of tin). At the backside of the substrate 5, a patterned backside isolation layer 45 is located with further openings at the locations of the through-substrate vias 10. A backside redistribution layer comprising backside redistribution conductors 50 is provided on the patterned backside isolation layer 45. Each respective one of the backside redistribution conductors 50 contacts a respective one of the through-substrate vias 10 though a respective one of the further openings in the patterned backside isolation layer 45. The backside redistribution conductors 50 are covered with a backside protection layer 60, such as a solder resist, silicon oxide or nitride, BCB, polyimid, SU-8. The backside protection layer 60 has a backside opening such that the redistribution conductors 50 may be connected to other substrates and/or pins of a package. Such connections may be established by a further solder ball 90 in the backside opening, for example.

In the example of FIG. 1, there is one through-substrate via per redistribution conductor on the front-side or back-side. However, in the invention this is not essential, there may be more than one through-substrate vias per redistribution conductor. By doing so, it is possible to let two redistribution conductors that are on a same side, cross each other. To achieve this, a path of one of the redistribution conductors is provided with a through-substrate via that runs to the backside. Form there the path continues via a backside redistribution conductor and a further through-substrate via that runs back to the front-side. The path is then continued via a further redistribution conductor.

One of the embodiments of the invention provides an attractive alternative for this relatively complicated crossing technique. This is discussed later in this description.

Figure 2:
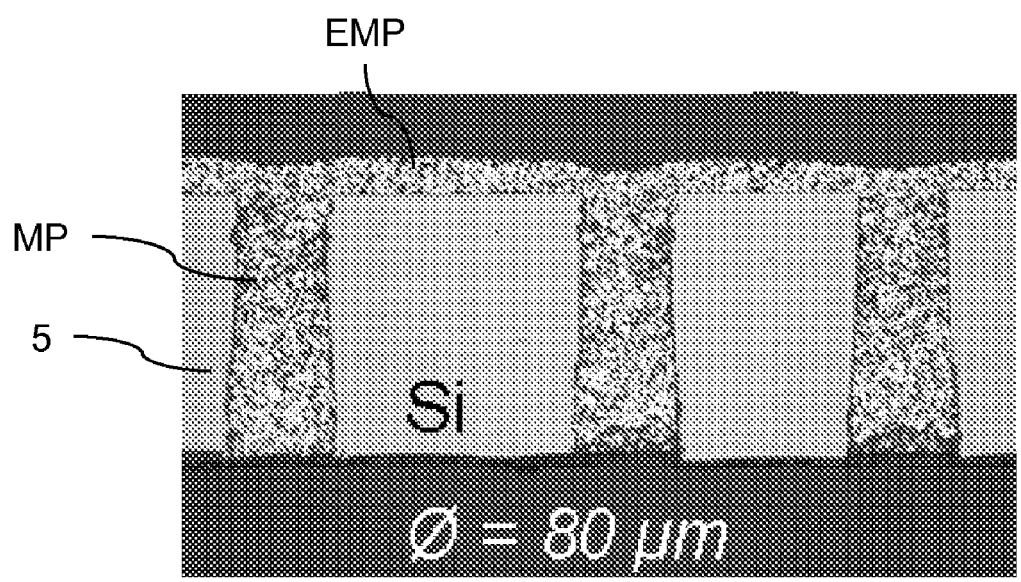
FIG. 2 shows a photograph of a semiconductor device having a through-substrate via that is filled with metal paste.

FIG. 2 shows a photograph of a semiconductor device having a through-substrate via that is filled with metal paste. Metal paste is generally provided by means of metal paste printing. The metal paste printing technique as such is known to the person skilled in the art. More information on metal paste printing can be found in the following reference: "*Handbook of 3-D Integration: Technology and Applications of 3D Integrated Circuits*", (P. Garrou, C. Bower and P. Ramm, eds.), Wiley-VCH Verlag, Weinheim, 2008, p. 511.

A metal paste typically consists of metal grains with a size of 2 to 3 μm, which are embedded in an organic binder. In case of copper paste the grains are typically silver coated copper grains. Metal paste has shown excellent properties for filling vias with a high aspect ratio, such as through-substrate vias, see for example the following two references:

F. Roozeboom et al., "*3D Passive and Heterogeneous Integration Technology Options for System-in-Package*", 2nd IEEE Workshop on 3D System Integration, Oct. 1-2, 2007, München, Germany, Sep. 27, 2007. This document is hereby incorporated by reference in its entirety.

F. Roozeboom et al., "*System-in-package integration of passives using 3D through-silicon vias*", Solid State Technology, May 2008, p. 38-41+47. This document is hereby incorporated by reference in its entirety.

When nanopastes are used (particles smaller than 100 nm) these pastes exhibit so-called anomaly of the melting point (lower than bulk/micropaste). Therefore these nanopastes can be better processed thermally (lower temperature, better fluidic behaviour, etc.).

After filling (by paste printing) of the vias with metal paste typically a curing step is done (i.e. 30 mins. at 160° C.). After curing the organic binder is substantially gone and the metal grains remain. Various different metals can be used as metal grains, such as: copper, silver, gold, platina, aluminum, Ag-coated Cu grains, alloys comprising at least two of the previous metals, compounds comprising a mixture of at least two of the previous metals, and even polymer conductors. Metal paste printing is expected be an attractive low-cost alternative for relative expensive techniques like electroplating and sputtering. Metal paste printing has been successfully used to fill blind via arrays in thick wafers and through-substrate vias in wafers thinned down to 200 μm by using vacuum-assisted paste printing under high-pressure. For the method of manufacturing the semiconductor device in accordance with the invention this means that the filling the hole and the trench may also be done after backside thinning of the substrate 5 (=the thinning down of the second side of the substrate).

FIG. 2 shows a substrate 5 having silicon material Si. The substrate 5 is provided with a plurality of holes having a diameter of 80 μm. The holes have been completely filled with metal paste MP, i.e. in this experiment it was a copper paste. Above the substrate excess metal paste EMP is visible. In the prior art this excess metal paste EMP is normally removed by means of planarization or etching. The inventors have realized that it is advantageous that this is not done in this way, as will be elucidated in the next figures.

Figure 3:
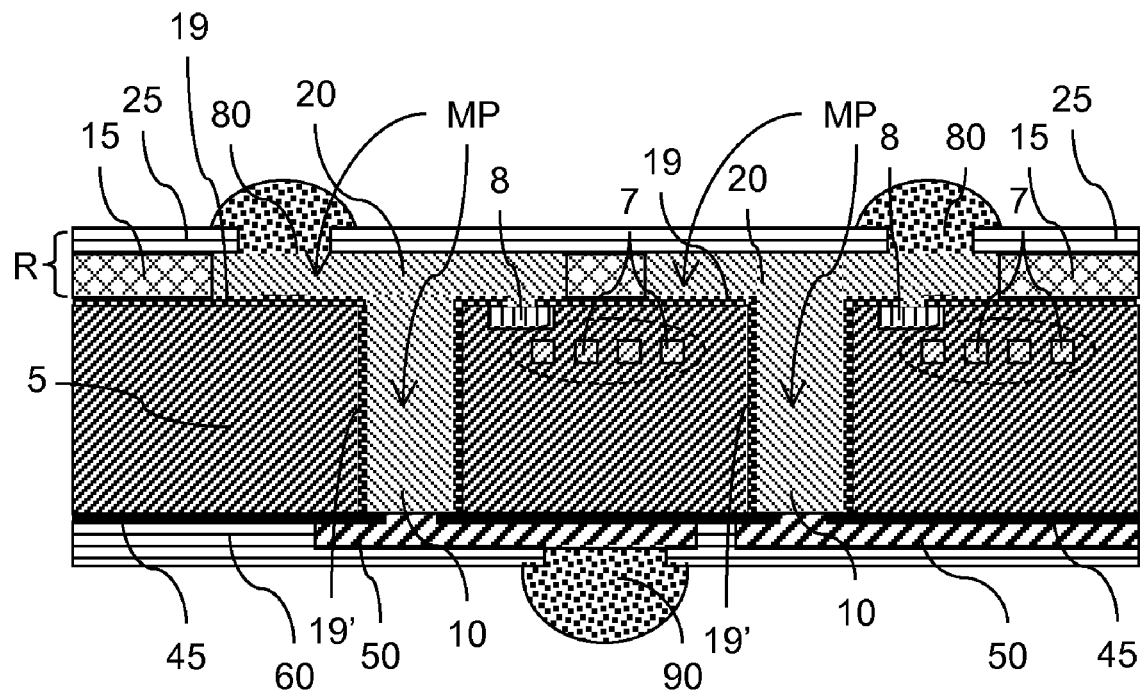
FIG. 3 shows a semiconductor device in accordance with a first embodiment of the invention.

FIG. 3 shows a semiconductor device in accordance with a first embodiment of the invention. The discussion of this embodiment will be restricted to the major differences with the semiconductor device of FIG. 1. Just like in FIG. 1, the semiconductor device comprises a redistribution layer R on a front-side thereof. However, instead of the protection layer 30 there is a patterned masking layer 15 on the substrate 5 (there still may be other layers in between for attachment purposes, etc). The patterned masking layer 15 may comprise materials, such as: print resist, a laminate resist (foil comprising epoxy or acrylate), or any other type of masking layer. Openings in this patterned masking layer 15 contain the redistribution conductors 20. A further difference is that the redistribution conductors 20 and the through-substrate vias 10 comprise a metal paste MP and form one-piece, i.e. there is no interface between the respective parts, because they have been filled in a single metal paste printing step. On top of the redistribution conductors 20 there is provided a patterned protection layer 25, such as a solder resist, silicon oxide or nitride, BCB, polyimid, SU-8. The patterned protection layer 25 comprises openings that extend to the redistribution conductors 20 such that the redistribution conductors 20 may be connected to other substrates and/or pins of a package. The redistribution layer R may be defined as the combination of the redistribution conductors 20, the patterned masking layer 15, and the protection layer 25.

Figure 4:
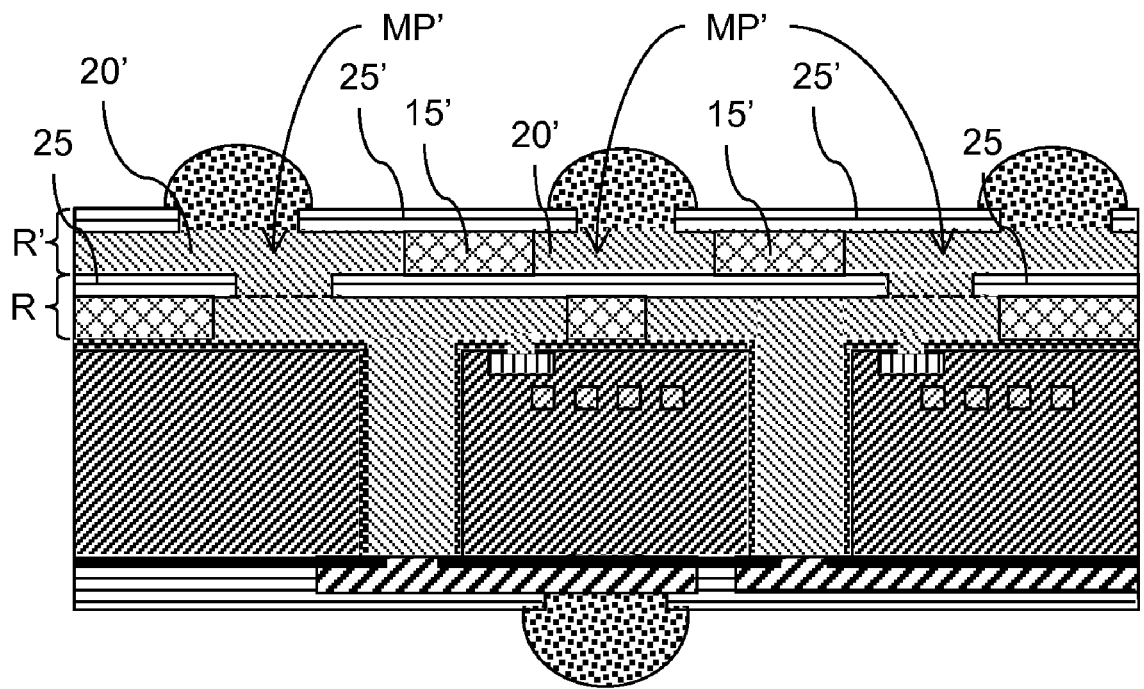
FIG. 4 shows a semiconductor device in accordance with a second embodiment of the invention.

FIG. 4 shows a semiconductor device in accordance with a second embodiment of the invention. This embodiment will be discussed in as far as it differs from the first embodiment of the semiconductor device in accordance with the invention. In this embodiment a further redistribution layer R' is provided on the earlier-mentioned redistribution layer R. This further redistribution layer R' comprises a further patterned masking layer 15' (for example comprising the same or similar materials as the earlier-mentioned masking layer 15). Openings of the further patterned masking layer 15' comprise further redistribution conductors 20'. The further redistribution conductors 20' may comprise further metal paste MP' and also extend into the openings in the earlier-mentioned protection layer 25 and thus effectively form one piece with contacts defined by these openings. Nevertheless, this is not essential. It is also possible to first fill the openings in the earlier mentioned protection layer 25 (with the further metal paste MP') and then provide the further patterned masking layer 15' and then fill the openings in the further patterned masking layer 15' with yet further metal paste. However, this may then create an additional interface between respective parts of the further redistribution conductors 20'. On top of the further redistribution conductors 20' and the further patterned masking layer 15' there is a further protection layer 25' (for example comprising the same or similar materials as the earlier-mentioned protection layer 25). The further redistribution layer R' may be defined as the combination of the further redistribution conductors 20', the further patterned masking layer 15', and the further patterned protection layer 25'. An advantage of the second redistribution layer is the increased routability. It has become easier to redistribute locations of through-substrate vias to locations of through-substrate vias in a further semiconductor device.

Method of Manufacturing

The via paste printing process is done on a wafer, for example a silicon wafer, on which the back-end-of-line processing has finished. In other words, the transistors and/or passive elements and there interconnections have already been formed. Even the first steps of the through-substrate via (TSV) formation have been done, such as via formation and via isolation. At this stage the deviation from conventional TSV processing occurs, as is illustrated in the following Figures.

FIGS. 5(a) to 5(h) illustrate different stages in a method of manufacturing the semiconductor device of FIG. 3 in accordance with the invention.

Figure 5A:
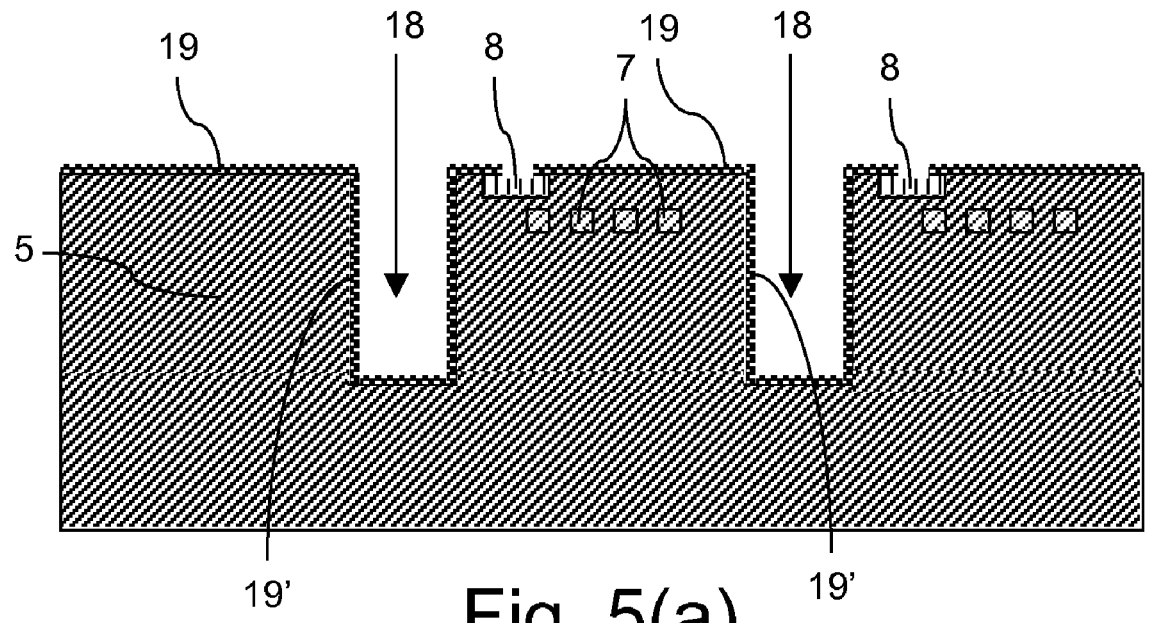
FIGS. 5(a) to 5(h) illustrate different stages in a method of manufacturing the semiconductor device of FIG. 3 in accordance with the invention.

In the stage of FIG. 5(a) the substrate 5 is provided having the active and passive functions 7 and the bondpads 8. In the substrate 5 there is provided two blind holes 18 which determine the location and dimension of the through-substrate vias to be formed. The blind holes 18 have been electrically isolated by means of the insulating layer 19 on the top surface (first side/front-side) of the substrate 5 and the further insulating layer 19' on sidewalls of the blind hole 18. The provision of the insulating layer 19 and the further insulating layer 19' is well-known to the person skilled in the art. Optionally, a barrier layer is provided on all sidewalls. Another option is the provision of a seed layer on the bottom of the blind hole. Both options are well-known to the person skilled in the art.

Figure 5B:
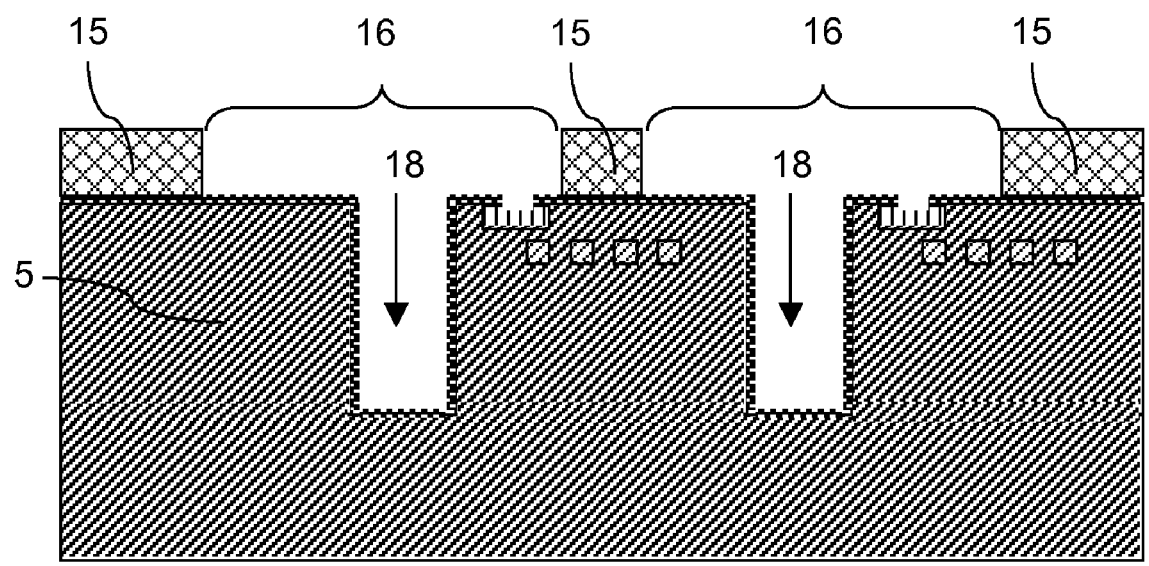

In the stage of FIG. 5(b) a patterned masking layer 15 is provided on the top surface of the substrate 5. The deposition and patterning of masking layers is well-known to the person skilled in the art. For layer deposition various techniques exist, such as: spin-coating, CVD, etc. For the patterning conventional lithography may be used. Nevertheless, the inventors have realized that it is particularly advantageous to provide the patterned masking layer before the filling of the blind holes 18. The patterned masking layer 15 comprises openings 16 which determine the location and dimension of the redistribution conductors to be formed. The openings 16 are provided such that they overlap (preferably fully) with the blind holes 18 in a perpendicular projection onto the substrate 5.

Figure 5C:
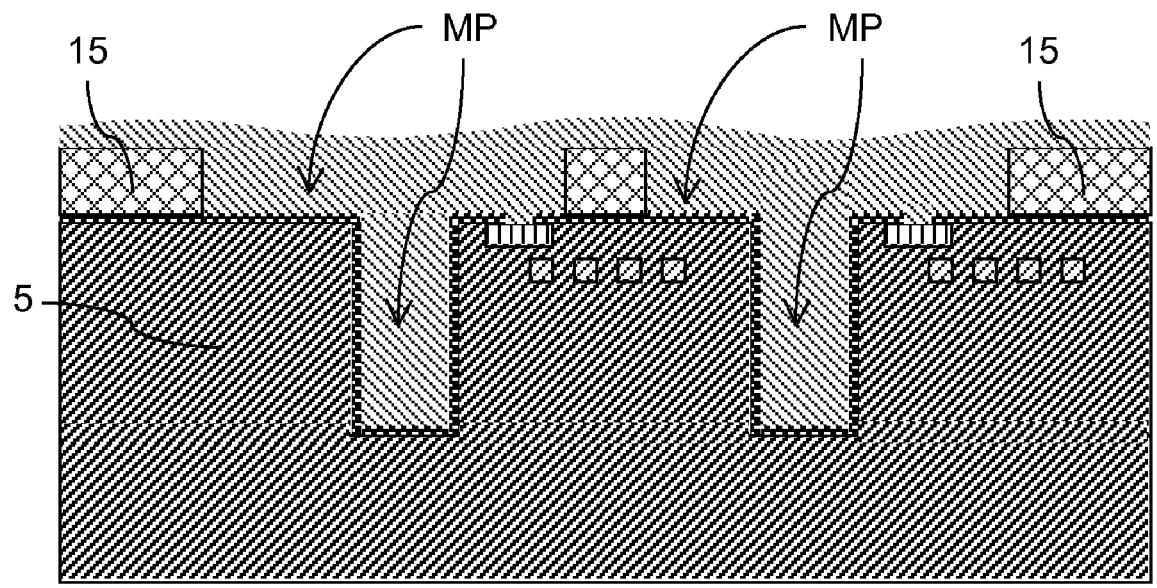

In the stage of FIG. 5(c) the holes 18 and the openings 16 are filled with metal paste MP, for example using a metal paste printing technique, for example a copper paste (or other conductive paste, e.g. silver) printing process is done. Consequently, there is no interface between the through-substrate via and the redistribution conductors to be formed.

Figure 5D:
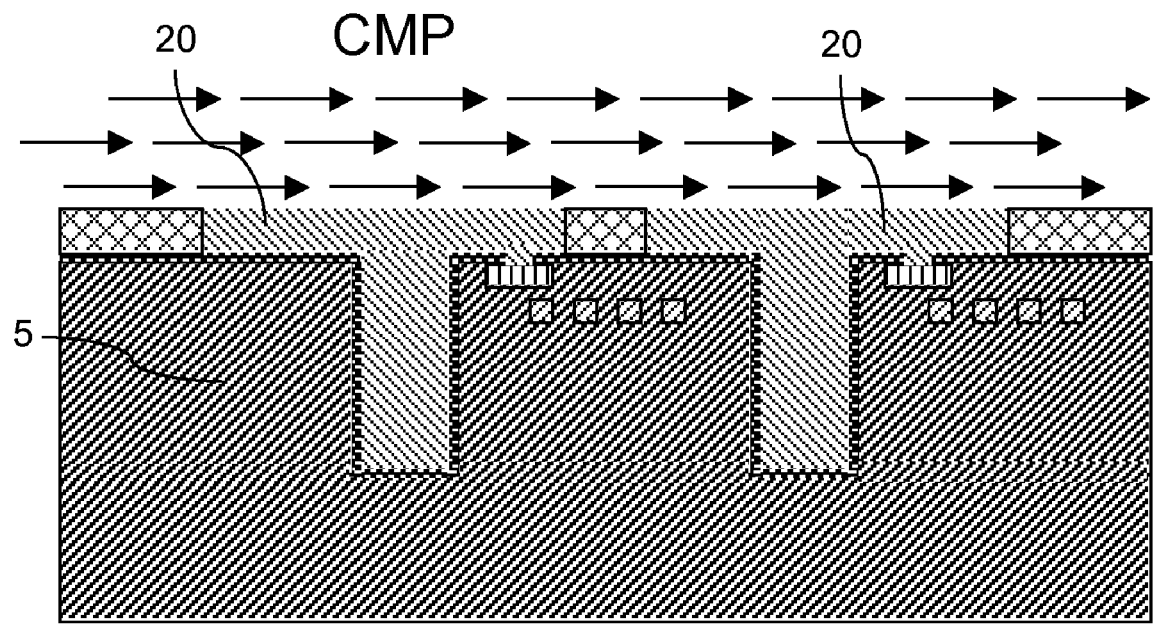

In the stage of FIG. 5(d) the top surface of the substrate 5 is planarized using chemical mechanical polishing CMP. Alternatively, it can be done using an anisotropic etching technique. The planarization is stopped when the patterned masking layer 15 is reached (or a little bit further). A flat top surface is obtained in this stage and the redistribution conductors 20 are completed in this stage.

Figure 5E:
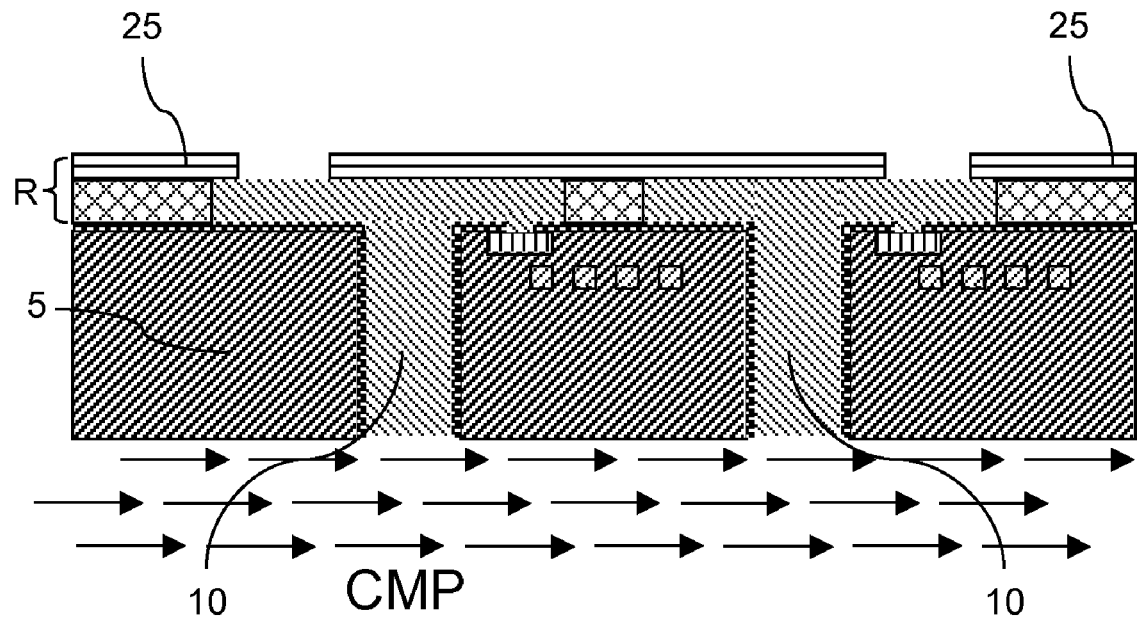

In the stage of FIG. 5(e) the patterned protection layer 25 is provided on the redistribution conductors 20 and the patterned masking layer 15. The deposition of layers is well-known to the person skilled in the art. The patterned protection layer 25 is provided with the openings that extend to the redistribution conductors 20 such that the redistribution conductors 20 may be connected to other substrates and/or pins of a package. The patterning of layers is well-known to the person skilled in the art. This step effectively completes the formation of the redistribution layer R.

Further, in the stage of FIG. 5(e) the bottom surface (second side/back-side) is planarized using chemical mechanical polishing CMP. Alternatively, it can be done using anisotropic etching. The planarization is continued until the metal paste in the blind holes 18 is exposed from the backside, which completes the formation of the through-substrate vias 10.

Figure 5F:
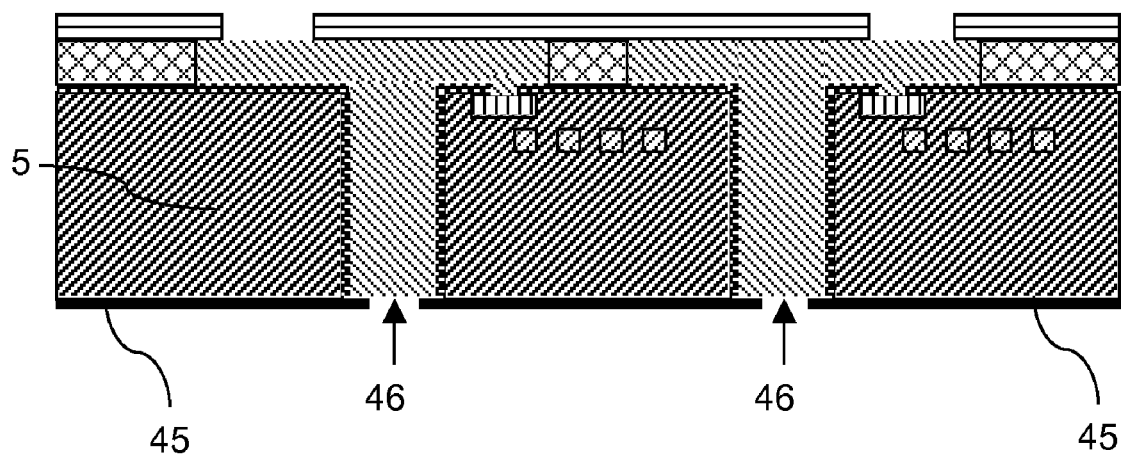

In the stage of FIG. 5(f) the backside isolation layer 45 is provided on the backside of the substrate 5. The backside isolation layer 45 is provided with openings 46 at the locations of the through-substrate vias to facilitate manufacturing of electrical contacts to them. The backside isolation layer 45 may comprise materials, such as: BCB (Benzocyclobutene) and polyimide.

Figure 5G:
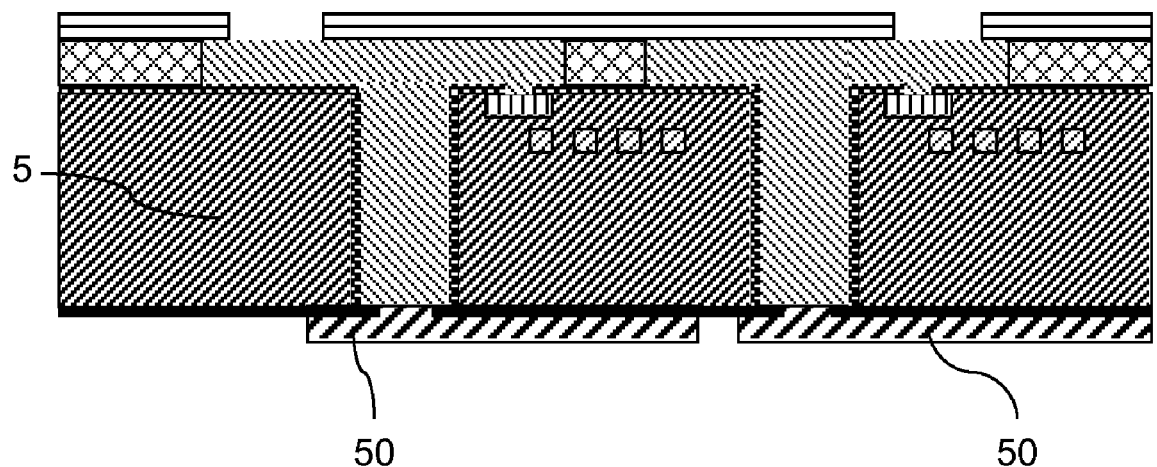

In the stage of FIG. 5(g) the backside redistribution conductors 50 are provided on the backside of the substrate 5. For this, conventional techniques such as electroplating, sputtering may be used. Furthermore, the patterning of this layer can be done using conventional patterning techniques, such as lithography.

Figure 5H:
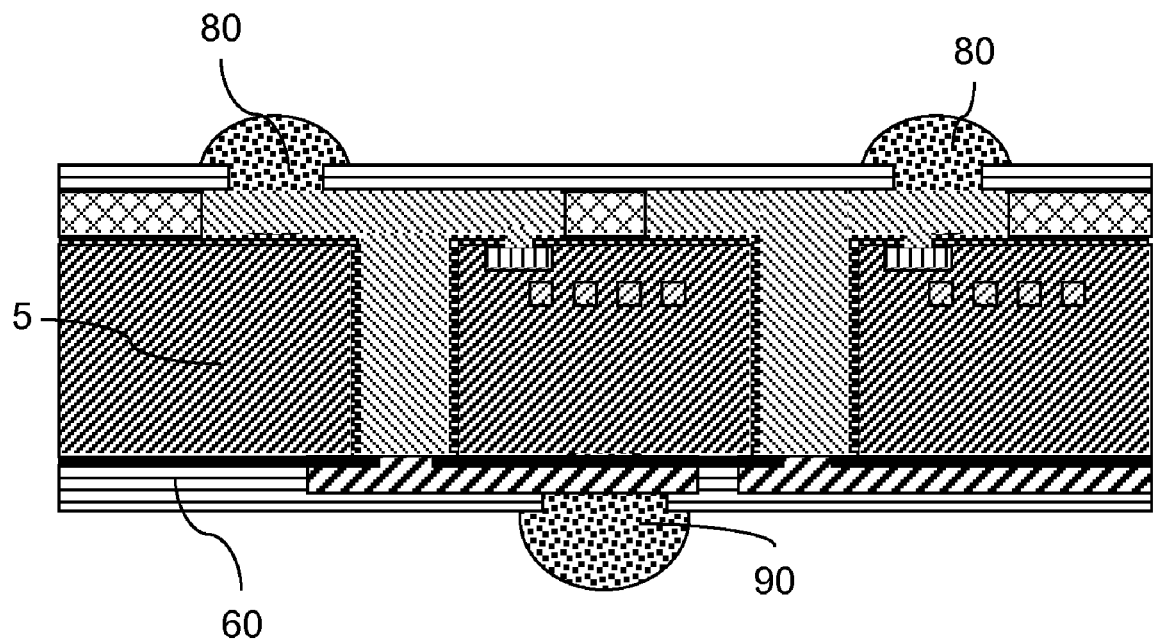

In the stage of FIG. 5(h) the backside protection layer 60 is provided. The backside protection layer 60 is provided with a backside opening for enabling electrical contact to one of the backside redistribution conductors 50. The backside protection layer 60 may comprise materials, such as: solder resist, silicon oxide or nitride, BCB, polyimid, SU-8.

Further, in the stage of FIG. 5(h) the electrical contacts to the (front-side) redistribution conductors 20 and the backside redistribution conductors 50 are made. These electrical contacts are in this example solder balls 80, 90. Alternatively, the electrical contacts can be bondwires. The provision of solders balls and bondwires falls within the conventional chip-finishing know-how.

The invention thus provides a semiconductor device for use in a stacked configuration of the semiconductor device and a further semiconductor device. The semiconductor device comprises: a substrate 5 comprising at least part of an electronic circuit 7 provided at a first side thereof. The substrate 5 comprises a passivation layer 19 at the first side and a substrate via 10 that extends from the first side to a via depth beyond a depth of the electronic circuit 7 such that it is reconfigurable into a through-substrate via 10 by backside thinning of the substrate 5. The semiconductor device further comprises: a patterned masking layer 15 on the first side of the substrate 5. The patterned masking layer 15 comprises at least a trench 16 extending fully through the patterned masking layer 15. The trench 16 has been filled with a redistribution conductor 20. The substrate via 10 and the redistribution conductor 20 comprise metal paste MP and together form one piece. The effect of the features of the semiconductor device of the invention is that there is no physical interface between those the through-substrate via 10 and the redistribution conductor 20. As a consequence of the invention the parasitic resistance of this electrical connection is reduced, which results in a better electrical performance of the semiconductor device. The invention further provides a method of manufacturing such semiconductor device. And the invention also provides a semiconductor assembly comprising a stacked configuration of a plurality of such semiconductor devices.

The invention may be applied in a wide variety of application areas, for example in system-in-package (SiP) applications wherein different substrates are stacked to form a 3D semiconductor assembly, and wherein each respective one of the substrates comprises parts of a system that need to be connected to other parts on other substrates.

Several variations of the semiconductor device and method of manufacturing in accordance with the invention are possible and do not depart from the scope of the invention as claimed. These variations for example relate to the order of the steps carried out in the method of manufacturing, to the materials used for the different layers, and for the techniques used to provide or manipulate the respective layers.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage. Throughout the Figures, similar or corresponding features are indicated by same reference numerals or labels.

The invention claimed is:

1. A semiconductor device for use in a stacked configuration of the semiconductor device and a further semiconductor device, the semiconductor device comprising:
   a substrate comprising at least part of an electronic circuit provided at a first side thereof, the substrate comprising a passivation layer at the first side and having a substrate via that extends from the first side to a via depth beyond a depth of the electronic circuit such that it is reconfigurable into a through-substrate via by backside thinning of the substrate, and
   a patterned masking layer on the first side of the substrate, wherein the patterned masking layer comprises at least a trench extending over the passivation layer and extending fully through the patterned masking layer and being filled with a redistribution conductor, and wherein the substrate via and the redistribution conductor comprise metal paste and together form one piece;
   wherein the substrate via and the redistribution conductor form an electrical connection with no physical interface between the substrate via and the redistribution conductor.

2. The semiconductor device as claimed in claim 1, wherein the first side of the substrate is planar, and wherein the redistribution conductor is confined within the trench.

3. The semiconductor device as claimed in claim 2, further comprising a patterned insulating layer on the patterned masking layer and the redistribution conductor, the patterned insulating layer having an opening extending to the redistribution conductor.

4. The semiconductor device as claimed in claim 3, further comprising a further patterned masking layer on the patterned insulating layer, wherein the further patterned masking layer comprises at least a further trench extending through the further patterned masking layer and defining a shape of a further redistribution conductor to be formed.

5. The semiconductor device as claimed in 4, wherein the opening and the further trench in the further patterned masking layer contain a further metal paste for forming the further redistribution conductor.

6. The semiconductor device as claimed in claim 5, wherein the first side of the substrate is planar, and wherein the further redistribution conductor is confined within the opening and the further trench.

7. The semiconductor device as claimed in claim 6, further comprising a further patterned insulating layer on the further patterned masking layer and the further redistribution conductor, the further patterned insulating layer having a further opening extending to the further redistribution conductor.

8. The semiconductor device as claimed in claim 1, wherein the substrate has been thinned down at a second side thereof such that the metal paste (MP) in the substrate via is exposed at the second side of the substrate to obtain the through-substrate via, wherein the second side of the substrate is defined as the side opposite to the first side.

9. The semiconductor device as claimed in claim 8, further comprising a patterned backside isolation layer on the second side of the substrate, wherein the patterned backside isolation layer has a backside opening at a location of the through-substrate via.

10. The semiconductor device as claimed in claim 9, further comprising a backside redistribution conductor at least in the backside opening on the second side of the substrate and covering at least part of the patterned backside isolation layer, wherein the backside redistribution conductor is electrically connected to the through-substrate via.

11. A method of manufacturing a semiconductor device for use in a stacked configuration of the semiconductor device and a further semiconductor device, the method comprising:
   providing a substrate with at least part of an electronic circuit provided at a first side thereof and comprising a passivation layer at the first side, the substrate having a hole that extends from the first side to a via depth beyond a depth of the electronic circuit for defining a location of a through-substrate via to be formed;
   providing a patterned masking layer on the first side of the substrate, wherein the patterned masking layer comprises at least a trench extending over the passivation layer and extending through the patterned masking layer and defining a shape of a redistribution conductor to be formed, and
   filling the hole and the trench in the patterned masking layer with a metal paste in a single process step to obtain a substrate via and the redistribution conductor, wherein the substrate via is reconfigurable into the through-substrate via by backside thinning of the substrate;
   wherein filling the hole and the trench in the patterned masking layer with a metal paste in a single process step forms an electrical connection with no physical interface between the substrate via and the redistribution conductor.

12. The method as claimed in claim 11, further comprising:
   planarizing the first side of the substrate at least until the patterned masking layer is reached.

13. The method as claimed in claim 11, further comprising:
   thinning down of a second side of the substrate for exposing the metal paste of the substrate via at the second side of the substrate to obtain the through-substrate via, wherein the second side of the substrate is defined as the side opposite to the first side.

14. A semiconductor assembly comprising a stacked configuration of a plurality of semiconductor devices as claimed in claim 8, wherein each respective through-substrate via of each respective one of the plurality of semiconductor devices is electrically connected to another respective through-substrate via of another respective one of the plurality of semiconductor devices.

* * * * *